United States Patent [19]

Remeika

[11] 4,318,741
[45] Mar. 9, 1982

[54] RARE EARTH METAL STANNIDES

[75] Inventor: Joseph P. Remeika, Warren Township, Somersel County, N.J.

[73] Assignee: Bell Telephone Laboratories, Incorporated, Murray Hill, N.J.

[21] Appl. No.: 155,678

[22] Filed: Jun. 2, 1980

[51] Int. Cl.³ .................. H01B 1/02; C22C 13/00
[52] U.S. Cl. .................. 75/175 R; 156/DIG. 63; 252/514; 252/521; 423/263
[58] Field of Search .................. 75/175; 423/263; 252/514, 521; 156/DIG. 63

[56] References Cited
PUBLICATIONS

Dwight, A. E. et al., "Journal of the Less-Common Metals", vol. 30; Jan. 1973; pp. 1–8.

Primary Examiner—G. O. Peters
Attorney, Agent, or Firm—Peter V. D. Wilde

[57] ABSTRACT

A new family of rare earth-rhodium-tin intermetallic compounds, with the representative formula $(RE)Rh_xSn_y$, has been synthesized in single crystal form. The compounds containing the heavier rare earths are superconducting and those with the lighter rare earths are generally magnetic. The compound $ErRh_{1.1}Sn_{3.6}$ exhibits reentrant superconductivity with $T_c=0.97$ K and $T_m=0.57$ K as determined from ac magnetic susceptibility measurements. The synthesis and X-ray characterization of the series are described and the results of electrical resistivity, upper critical magnetic field, magnetic susceptibility, specific heat and neutron scattering measurements on the Er compound are given.

7 Claims, 2 Drawing Figures

RARE EARTH METAL STANNIDES

BACKGROUND OF THE INVENTION

Considerable research activity has recently been focused on the interaction between superconductivity and long-range magnetic order. See, for example, M. B. Maple, in the *Proceedings of the* 15th International Conference on Low Temperature Physics, Journal de Physique Supplement C6-1374 (1978), and M. Ishikawa, O. Fischer and J. Muller, ibid. C6-1379 (1978). S. Maekawa and M. Tachiki, *Physical Review B* 18, 4688 (1978). H. Suhl, *Journal of Less Common Metals* 62, 225 (1978). E. I. Blount and C. M. Varma, *Physical Review Letters* 42, 1079 (1979). Two classes of ternary compounds exhibiting these phenomena have been reported: the Chevrel phases typified by $RE_xMo_6S_8$ (O. Fischer, A. Treyvaud, R. Chevrel, and M. Sergent, *Solid State Communications* 17, 721 (1975)) and $RE_xMo_6Se_8$ (R. N. Shelton, R. W. McCallum and H. Adrian, *Physics Letters A* 56, 213 (1976) and the tetraborides such as $(RE)Rh_4B_4$. B. T. Matthias, E. Corenzwit, J. M. Vandenberg, and H. Barz, *Proceedings of the National Academy of Sciences, U.S.A.* 74, 1334 (1977).

SUMMARY OF THE INVENTION

This invention is based on the discovery of a new family of rare earth-rhodium-tin intermetallic compounds having the representative formula $RE\ Rh_x\ Sn_y$ and related intermetallic compounds with prescribed substitutions for rhodium. This family of compounds forms non-stoichiometrically and the x and y values in the representative formula vary depending upon the rare earth in the compound. As in the tetraborides of the prior art, the Er compound displays reentrant superconductivity and for the adjacent members of the RE series the superconducting transition temperature increases to the right and the magnetic transition temperature increases to the left of Er. A comparison of resistivity, upper critical magnetic field, ac magnetic susceptibility, neutron scattering, and heat capacity measurements on the Er compound is presented in the ensuing detailed portion of the description along with a table giving data on the entire series of compounds in the family.

The new family of ternary intermetallic stannides reported here employs no metalloids, and is thus the first class of compounds exhibiting superconductivity and magnetism wherein all constituents are metals. Furthermore, all the compounds have been prepared as single crystals. There are three distinct crystal phases which are compositionally similar. The compounds were synthesized as single crystals by crystallization from an excess of liquid tin employed as a solvent.

DETAILED DESCRIPTION

Figure 1:
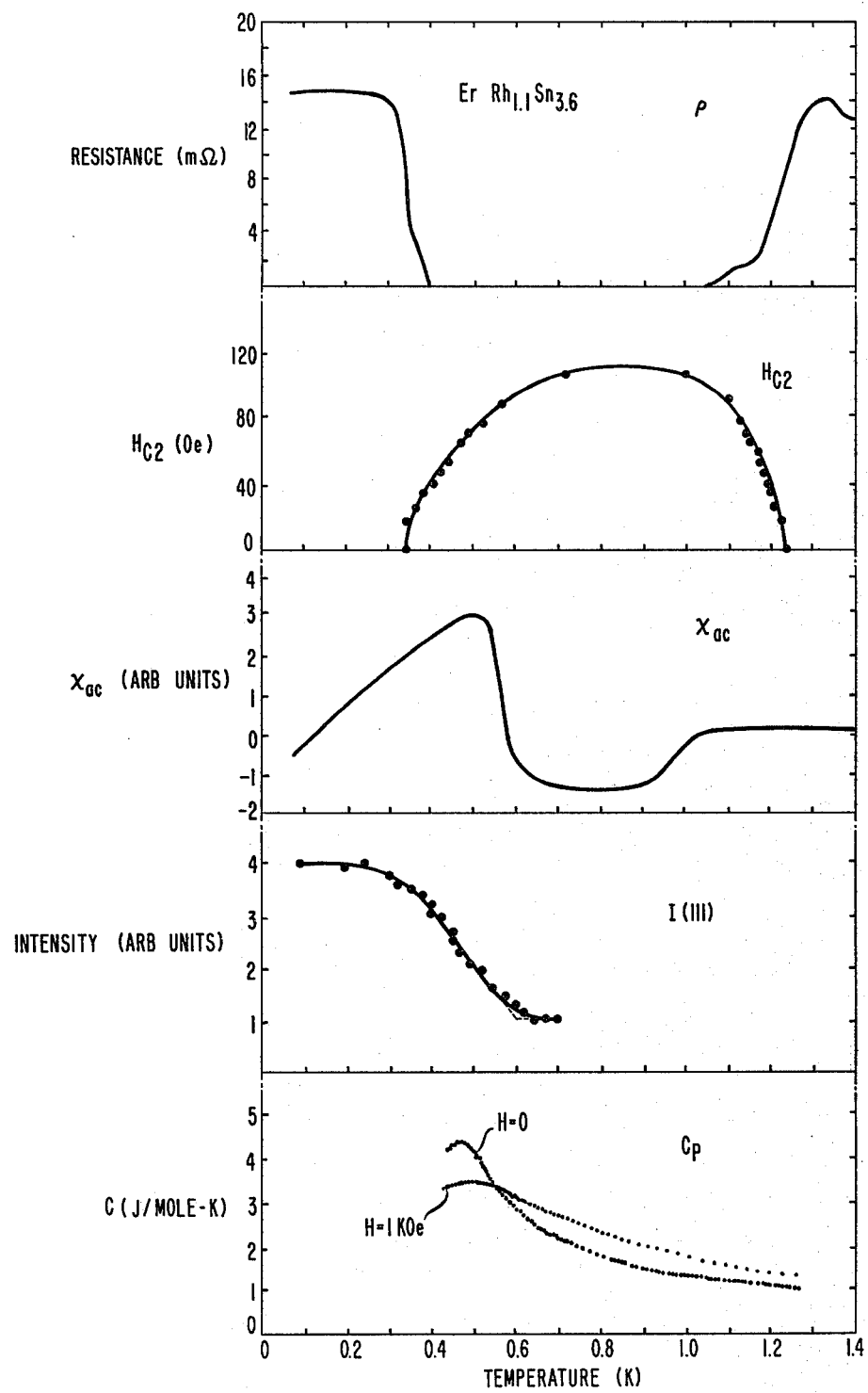
FIG. 1 is a graphical representation of various properties of a representative member of the rare earth-rhodium stannide family of compounds.

Single crystals of all compounds were grown by dissolving the constituent metals in an excess of tin. The process was carried out in evacuated, sealed fused silica tubes. The tin used was 5 N's purity from Cominco American, Inc.; rare earth metals were of 3 to 4 N's purity obtained from Research Chemicals. Noble metals were of the highest purity obtainable from Engelhard Industries. All other materials used were of at least equivalent purity. A typical growth sequence, say for $ErRh_{1.1}Sn_{3.6}$, was carried out by weighing 0.2788 gms Er, 0.1715 gms Rh, and 5.00 gms Sn into a silica tube 7.0 mm I.D. $\times$ 9.0 mm O.D. The tube was evacuated, sealed off to a length of ~8 cm, and supported vertically in a horizontally loaded, resistively heated furnace. Controlled temperature was held at 1050 degrees C. for 2 hours to effect reaction and solution. A cooling rate of 5 to 10 degrees C. per hour was initiated and the program continued down to ~575 degrees C. when the tube was removed from the furnace and allowed to cool to room temperature. This "quench" was done to preserve good crystal surfaces, whereas if slow cooling was carried on to solidification, crystal surfaces were often marred by precipitates. When the solidified boule was placed in concentrated HCl, care was taken to remove the crystals as soon as they were loose, as prolonged exposure to HCl resulted in a black surface rather than the highly polished metallic surface otherwise obtained. We have determined by X-ray diffraction and fluorescence that the black surface material is an amorphous composition of rhodium and tin, the erbium having been leached out by the HCl. Chemical analysis gave a composition for the erbium compound of $ErRh_{1.1}Sn_{3.6}$. Analyses of selected compounds, all of which were done in duplicate, are given in the following table:

TABLE I

Properties of $MRh_xSn_y$

| Compound | Structure (Phase) | Lattice Constant A | Density gm/cc 25° C. | Super-cond. $T_c(K)$ | Magnetic $T_m(K)$ | Critical Field $dH_{c2}$ $dT(T = T_c)$ KG/K | Resist. $\rho_{300K}$ $\mu\Omega$cm | Resist. Ratio $\rho_{300K}/\rho_{10K}$ |
|---|---|---|---|---|---|---|---|---|
| $LaRh_{1.2}Sn_{4.5}$ | I | 9.745 | | $3.2-3.0^{(a)}$ | | | | |
| $CeRh_{1.2}Sn_{4.0}$ | I | 9.710 | 8.3 | | | | | |
| $PrRh_{1.2}Sn_{4.2}$ | I | 9.693 | | | | | 114 | 21 |
| $NdRh_{1.2}Sn_{4.1}$ | I | 9.676 | 8.4 | | | | | |
| $SmRh_{1.2}Sn_{4.3}$ | I | 9.657 | 8.7 | | | | | |
| $EuRh_{1.2}Sn_{3.9}$ | I | 9.749 | | | ~$11^{(c)}$ | | | |
| $GdRh_{1.1}Sn_{3.7}$ | I | 9.638 | | | $11.2^{(b)}$ | | | |
| $TbRh_{1.1}Sn_{3.6}$ | III | 13.774 | 8.7 | | $(c)\ \{\ 3.8^{(a)},\ 2.8\}$ | | | |
| $DyRh_{1.1}Sn_{3.6}$ | III | 13.750 | 8.8 | | $2.8^{(a)}$ | | | |
| $HoRh_{1.2}Sn_{3.9}$ | II | | 8.9 | | $1.68^{(a)}$ | | 310 | 0.84 |

TABLE I-continued

Properties of $MRh_xSn_y$

| Compound | Structure (Phase) | Lattice Constant A | Density gm/cc 25° C. | Supercond. $T_c(K)$ | Magnetic $T_m(K)$ | Critical Field $dH_{c2}/dT(T=T_c)$ KG/K | Resist. $\rho_{300K}$ $\mu\Omega$cm | Resist. Ratio $\rho_{300K}/\rho_{10K}$ |
|---|---|---|---|---|---|---|---|---|
| $HoRh_{1.2}Sn_{3.9}$ | III | 13.750 | | | | | | |
| $ErRh_{1.1}Sn_{3.6}$ | II | | 9.1 | $1.31^{(a)}$ $1.22^{(b)}$ $0.97^{(c)}$ | $0.34^{(b)}$ $0.57^{(c)}$ $0.61^{(d)}$ | | 340 | 0.85 |
| $ErRh_{1.1}Sn_{3.6}$ | III | 13.714 | | | | | | |
| $TmRh_{1.3}Sn_{4.0}$ | II | | 9.2 | $2.3-2.2^{(a)}$ | | | 286 | 0.94 |
| $TmRh_{1.3}Sn_{4.0}$ | III | 13.701 | | | | | | |
| $YbRh_{1.4}Sn_{4.6}$ | I | | 8.9 | $8.6-8.2^{(a)}$ | | 3.5 | | |
| $LuRh_{1.2}Sn_{4.0}$ | II | | 9.6 | $4.0-3.9^{(a)}$ | | 20.3 | | |
| $YRh_xSn_y$ | II | | | $3.2-3.1^{(a)}$ | | 21.5 | 290 | 1.03 |
| $ScRh_xSn_y$ | II | | | $4.5-4.1^{(a)}$ | | | | |
| $ThRh_xSn_y$ | I | 9.692 | | $1.9-1.7^{(a)}$ | | 9.3 | 140 | 4.3 |
| $CaRh_{1.2}Sn_{4.5}$ | I | 9.702 | 8.3 | $8.7-8.6^{(a)}$ | | 4 | 110 | 8.8 |
| $SrRh_xSn_y$ | I | 9.800 | | $4.3-4.0^{(a)}$ | | | | |

Phase I = Primitive cubic, $a_o \sim 9.7$ A
Phase II = Tetragonal, $a \sim 13.7$, $c \sim 9.7$ A
Phase III = Face centered cubic, $a_o \sim 13.7$ A
$^{(a)}$ = Measured inductively
$^{(b)}$ = Measured resistively
$^{(c)}$ = Susceptibility measurement
$^{(d)}$ = Neutron scattering
$^{(e)}$ = Two $T_m$'s observed on same crystal Crystals obtained by this procedure were typically 1-2 mm on an octahedral edge. We occasionally see a trace of superconductivity at ~3.7 K which we believe is due to entrapped Sn. Two different crystallographic phases, designated II and III, here and in Table I are sometimes found in a single melt possibly due to either compositional gradients too small to detect chemically, or different degrees of sublattice order. Arc-melted samples where the constituents were weighed for the composition $ErRh_{1.1}Sn_{3.6}$, produced the f.c.c. phase III material only, with weak lines of elemental Sn as determined by X-ray powder diffraction. Other experiments of this kind indicated a narrow range of composition for cubic phase III, with a broader range for tetragonal phase II.

Each compound was examined by powder X-ray diffraction using a 114.6 mm Debye-Scherrer camera and filtered Cr $K_\alpha$ radiation. The symmetry was established from precession photographs of the Yb and $ErRh_xSn_y$ compounds using filtered Mo $K_\alpha$ radiation. The crystallographic data for the series are reported in columns 2, 3 and 4 of Table I. Phase I is primitive cubic with $a_o\sim 9.7$ Angstroms, and is found in those compounds where RE is La to Gd and also with Yb, Th, Ca or Sr. The $YbRh_{1.4}Sn_{4.6}$ compound is distinguished from the other compounds of phase I by showing a broadening of some high angle lines in its X-ray powder diffraction photograph, which may be indicative of a degree of disorder. The systematic absenses are hhl with $l\neq 2n$ leading to possible space groups P43m (#218) or Pm3n (#223). Phase II is tetragonal with a ~13.7 Angstroms and c ~9.7 Angstroms. It is found in those compounds where RE is Ho, Er, Tm, Lu and also with Y or Sc. Phase III is face centered cubic with $a_o\sim 13.7$ Angstroms; here RE can be Tb to Tm. One notes that the lattice parameters of phases I and III are related by $\sqrt{2}$, and that $c/a=1/\sqrt{2}$ in phase II.

Compounds with Co and Ru replacing Rh were prepared which also fall into this new class. A large number of compounds were made with Ir replacing Rh. Of these, La, Ca and Sr were of yet a third phase, designated phase I, and superconducting with $T_c$'s at ~2.6, ~7.1, and ~5.1 K., respectively. All of the systems were further permuted by substituting elements such as Ca, Sr, Mg, Cd, Y, Sc, Zn, In or Th for the RE. Partial substitutions for Sn up to about 1 atom were made using Pb, Bi, and Ge.

The superconducting and magnetic transition temperatures above 1.1 K. were determined by ac inductance measurements using a frequency of 13 cycles. The results are given in the fifth and sixth columns of Table I. The compounds containing Yb and Ca have superconducting transition temperatures greater than 8 K. There are magnetic transistions for RE compounds containing Eu to Er with $T_m$ decreasing the heavier the rare earth. Superconductivity appears at Er where it is reentrant, and $T_c$ increases toward 4 degrees K. at Lu, with the exception of Yb where $T_c$ is at 8.9 K.

In order to further characterize the series, the slope of the upper critical field with respect to temperature just below $T_c$, $(dH_{c2}/dT)_{T=T_c}$, is shown in column 7 of Table I. Finally, the resistivity at 300 K. and the resistivity ratio ($\rho_{300}/\rho_{4.2}$) are given for representative members of the series in the last two columns of Table I. As can be seen the room temperature resistivity is lower and the resistivity ratio higher for the compounds in phase I. This suggests a high degree of disorder in the crystals of phases II and III, but further study will be needed to understand the microscopic origin of this difference.

To establish in more detail the reentrant superconductive behavior of the Er compound, a number of different measurements were made for $0.08 \leq T \leq 1.4$ K including electrical resistivity, upper critical field, ac magnetic susceptibility, neutron scattering and heat capacity; these measurements are displayed in FIG. 1. They clearly establish that at low temperatures the Er compound has fairly long-range ferromagnetic order that destroys the superconductivity; much as is seen in the Chevrel compounds and the RE tetraborides.

The low frequency (15 Hz) ac electrical resistivity measurements in zero and applied magnetic fields and the low frequency (15 Hz) ac magnetic susceptibility measurements were made, respectively, on bars and powders prepared from a single crystal of $ErRh_{1.1}Sn_{3.6}$. The measurements were made at temperatures between 70 mK and 2.0 K. in a $He^3$-$He^4$ dilution refrigerator cryostat. The temperatures at which the ac electrical resistance dropped to 50% of its normal state value (taken just above $T_c$) in each applied magnetic field were used to define the values of $T_c$ and $T_m$ in determining $H_{c2}$. The $x_{ac}$ data give the values $T_c=0.97$ K. and $T_m=0.57$ K., while the ac electrical resistivity and upper critical field measurements give $T_c=1.22$ K. and $T_m=0.34$ K. No thermal hysteresis was observed in the transition at $T_m$ in these measurements, in contrast to the behavior previously reported for ternary RE compounds which exhibit reentrant superconductive behavior. A neutron scattering measurement gives $T_m=0.61$ K. The disparity in the values of the transition temperatures may be due to varying degrees of sublattice order. The neutron scattering measurements were done at the High Flux Beam Reactor at Brookhaven National Laboratory on a crystal 3-4 mm on a side which was mounted in an hhl scattering plane in an $He^3$-$He^4$ dilution refrigerator. Bragg intensities were measured in $\theta$-$2\theta$ scans through the various positions with integral h and l, and also some half integral values both at T=0.07 K. and 0.8 K. The only magnetic intensity (I(0.07 K.)-I(0.8 K.)) appeared at Bragg positions allowed in the f.c.c. lattice. It is clear therefore that the ordering is ferromagnetic. The intensity of the (111) peak was measured on heating and cooling and the results are shown in FIG. 1. The transition appears to be continuous and no hysteresis could be observed. However, the width of the magnetic contribution to the intensity of the (111) reflection was slightly broader than resolution suggesting that true long-range magnetic order had not developed to temperatures of T=0.07 K.

The heat capacity ($C_p$) data for a single crystal specimen of the Er compound between 0.4 and 1.4 degrees K. are shown at the bottom of FIG. 1, (measurements were taken up to 40 K.). The measurements were performed with a $He^3$ calorimeter using a standard heat pulse technique. There is a clear lambda-type anomaly which exhibits a peak at T=0.47 K. in zero applied magnetic field. A rough estimate of the entropy, S, below 3.5 K. is consistent with a value S=R ln 2 per mole of Er suggesting that the ground state of the $Er^{3+}$ may be a doublet.

Figure 2:
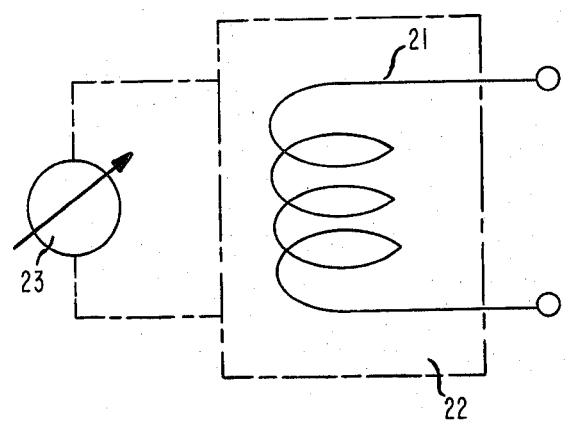
FIG. 2 is a schematic representation of an electrical device using an electrically conducting element formed from one of the materials described.

FIG. 2 shows schematically a device incorporating a material of the novel class described herein. The device is an electrically conducting coil 20 and means 21 for controlling the environment in which the coil functions. The control means is schematically shown to suggest alternative structural forms. Most typically the control means will be a thermal device for controlling the temperature of the coil 20. It may also include means for controlling the magnetic field in which the coil functions. The control is typically variable as indicated by adjustment means 23. The assembly of FIG. 2 can be used for superconducting devices by appropriately adjusting the temperature to below the superconducting transition temperature found in Table 1. Magnetic devices can be made using the same configuration by adjusting the coil to below the Curie temperature. Change of the external field can be used for switching between superconducting and non-superconducting states.

Various additional modifications and extensions of this invention will become apparent to those skilled in the art. All such variations and deviations which basically rely on the teachings through which this invention had advanced the art are properly considered to be within the spirit and scope of this invention.

What is claimed is:

1. Device comprising an electrically conductive element and characterized in that the element comprises a material having the formula:

$$A\ B_x\ Sn_y\ C_z$$

where x and y are numbers approximately fixed depending on the identity of the atom A, A and the associated numbers are selected from the group consisting of:

| | | |
|---|---|---|
| La(x = 1.2, y = 4.5), | Ce(x = 1.2, y = 4.0), | Pr(x = 1.2, y = 4.2), |
| Nd(x = 1.1, y = 4.1), | Sm(x = 1.2, y = 4.3), | Eu(x = 1.2, y = 3.9), |
| Gd(x = 1.1, y = 3.7), | Tb(x = 1.1, y = 3.6), | Dy(x = 1.1, y = 3.6), |
| Ho(x = 1.2, y = 3.9), | Er(x = 1.1, y = 3.6), | Tm(x = 1.3, y = 4.0), |
| Yb(x = 1.4, y = 4.6), | Lu(x = 1.2, y = 4.0), | Ca(x = 1.2, y = 4.5), | and mixtures of these,
  B is selected from the group consisting of Rh, Ir, Co, Ru and mixtures thereof,
  C is selected from the group consisting of Pb, Bi, Ge and mixtures thereof,
  and z has a value in the range of 0 to 1.
2. The device of claim 1 in which B is rhodium.
3. The device of claim 2 in which A is Yb, Er, or Lu.
4. The device of claim 3 in which A is Er.
5. The device of claim 1 further including means for cooling the electrically conductive element.
6. The device of claim 5 in which the element is a coil.
7. The device of claim 6 further including means for applying a the magnetic field surrounding the coil.

* * * * *